(12) United States Patent
Santos et al.

(10) Patent No.: US 8,890,339 B1
(45) Date of Patent: Nov. 18, 2014

(54) SELF-DEFINING, LOW CAPACITANCE WIRE BOND PAD

(71) Applicants: Fernando A. Santos, Chandler, AZ (US); Margaret A. Szymanowski, Chandler, AZ (US); Mohd Salimin Sahludin, Sungai Gadut (MY)

(72) Inventors: Fernando A. Santos, Chandler, AZ (US); Margaret A. Szymanowski, Chandler, AZ (US); Mohd Salimin Sahludin, Sungai Gadut (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/873,752

(22) Filed: Apr. 30, 2013

(51) Int. Cl.
*H01L 21/44* (2006.01)
*H01L 21/768* (2006.01)
*H01L 23/49* (2006.01)

(52) U.S. Cl.
CPC .............. *H01L 23/49* (2013.01); *H01L 21/768* (2013.01)
USPC ............................ 257/784; 257/780; 257/781

(58) Field of Classification Search
USPC .......................................... 257/784, 780, 781
See application file for complete search history.

(56) References Cited

U.S. PATENT DOCUMENTS

| | | | |
|---|---|---|---|
| 6,137,138 A | 10/2000 | Hebert | |
| 6,310,394 B1 | 10/2001 | Anand et al. | |
| 6,388,331 B1 | 5/2002 | Bond et al. | |
| 6,633,087 B2 | 10/2003 | Ker et al. | |
| 2002/0017729 A1 | 2/2002 | MacPherson | |

*Primary Examiner* — Long Pham
(74) *Attorney, Agent, or Firm* — Johnathan N. Geld

(57) ABSTRACT

A bond pad region is provided that reduces parasitic capacitance generated between bond pad metallization and underlying silicon by reducing the effective area of the bond pad, while maintaining flexibility of wire bond sites and ensuring mechanical integrity of the wire bonds. Embodiments provide, in a region that would be populated by a traditional bus bar bond pad, a small bus bar bond pad that is less than half the area of the region and populating at least a portion of the remaining area with metal tiles that are not electrically connected to the small bus bar bond pad or to each other. The metal tiles provide an attachment area for at least a portion of one or more wire bonds. Only those tiles involved in connection to a wire bond contribute to parasitic capacitance, along with the small bus bar pad.

15 Claims, 5 Drawing Sheets

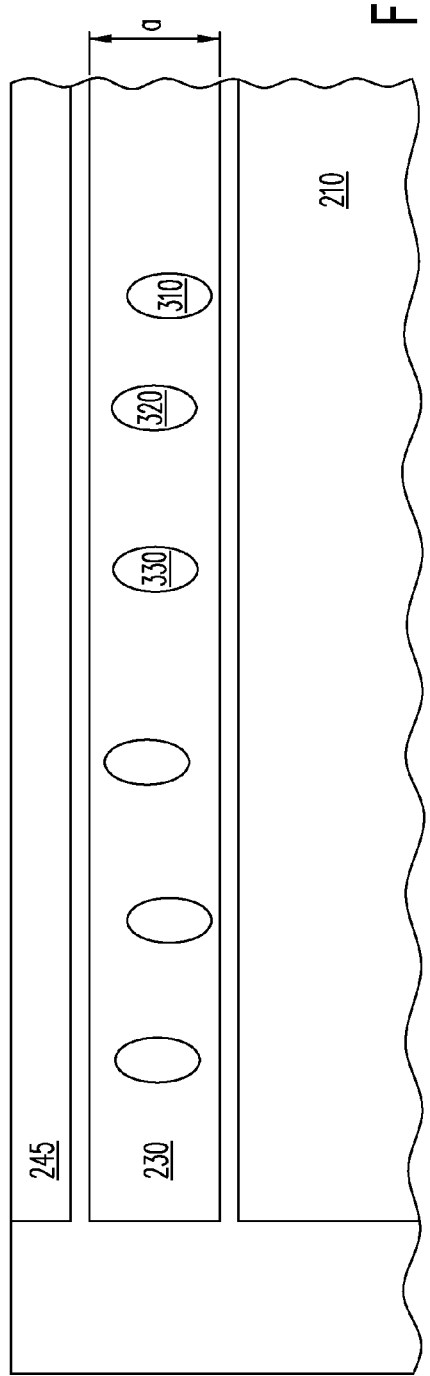
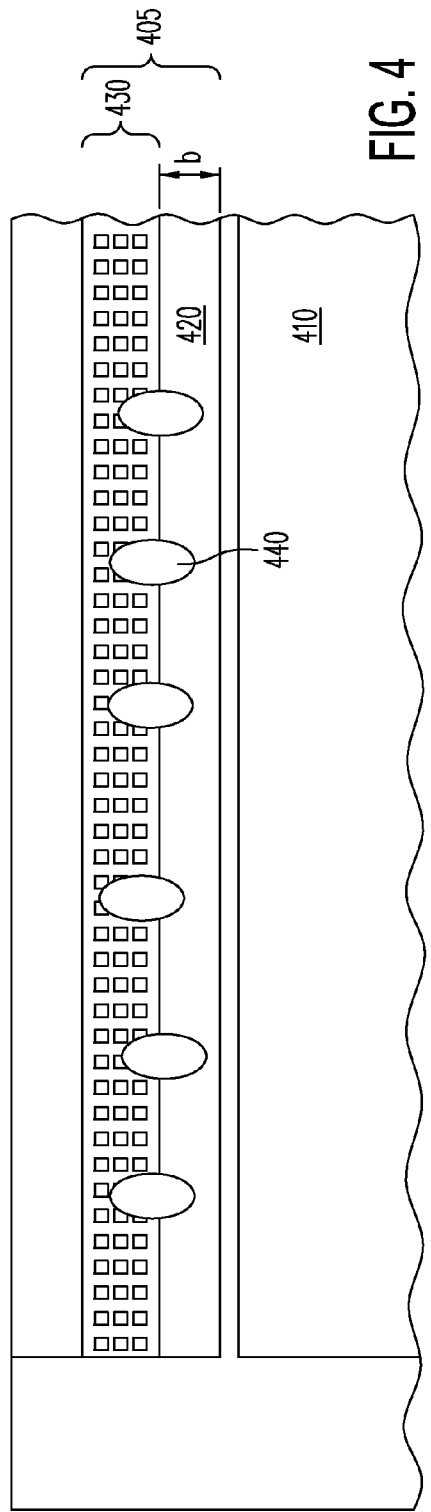

SELF-DEFINING, LOW CAPACITANCE WIRE BOND PAD

BACKGROUND

1. Field

This disclosure relates generally to semiconductor devices, and more specifically, to reducing capacitance contributions due to bond pad area of a semiconductor device.

2. Related Art

Primary design considerations for power transistors used in radio frequency (RF) applications generally include output power level, reliability, stability, and efficiency. Stability, reliability and low resistance of high frequency MOSFET RF power transistors make them well suited for many RF power amplifier applications.

One consideration in designing a power transistor is minimizing generated capacitances, in order to maximize RF signal gain and minimize signal distortion. Efforts at reducing capacitances have traditionally focused on the active area of the transistor (e.g., drain-to-source capacitance and the like). But overall capacitance contributions in a power transistor comes from more than just the active area of the device, and include parasitic capacitances generated by, for example, bond pads.

Typical wire bond pads in RF transistor devices include bus bars to which wire bonds are connected. The large area of the bus bars allows, for example, flexibility in locating wire bond connections. But the large metal area of the bus bar also results in a high parasitic capacitance generated between the metalized bus bar bond pad and the underlying silicon layer of the device. Since this parasitic capacitance is directly proportional to the area of the bus bar bond pad, reducing the bus bar area can reduce the capacitance, but such a reduction will also reduce the mechanical area on which to connect a wire bond. Some traditional methods of reducing the area of the bond pad have included providing only specific areas at which a wire bond can be formed, but this limits flexibility in locating wire bonds. It is therefore desirable to provide a bond pad region that both reduces parasitic capacitance contributed by the bond pad and maintains a sufficient metallic surface region on which to form wire bonds.

BRIEF DESCRIPTION OF THE DRAWINGS

The present invention may be better understood, and its numerous objects, features, and advantages made apparent to those skilled in the art by referencing the accompanying drawings.

FIG. 3 is a simplified block diagram illustrating an example of wire bond placement for a MOSFET transistor having traditional bonding pads.

FIG. 4 is a simplified block diagram illustrating an example of wire bond placement for a MOSFET transistor having a bonding pad region configured in accord with embodiments of the present invention.

The use of the same reference symbols in different drawings indicates identical items unless otherwise noted. The figures are not necessarily drawn to scale.

DETAILED DESCRIPTION

A bond pad region is provided that reduces parasitic capacitance generated between bond pad metallization and underlying silicon by reducing the effective area of the bond pad, while maintaining flexibility of wire bond sites and ensuring mechanical integrity of the wire bonds. Embodiments provide, in a region that would be populated by a traditional bus bar bond pad, a small bus bar bond pad that is less than half the area of the region and populating at least a portion of the remaining area with metal tiles that are not electrically connected to the small bus bar bond pad or to each other. The metal tiles provide an attachment area for at least a portion of one or more wire bonds. Only those tiles involved in connection to a wire bond contribute to parasitic capacitance, along with the small bus bar pad. Through use of such embodiments, parasitic capacitance contributed by the bond pad region can be reduced by 50% or more.

Figure 1:
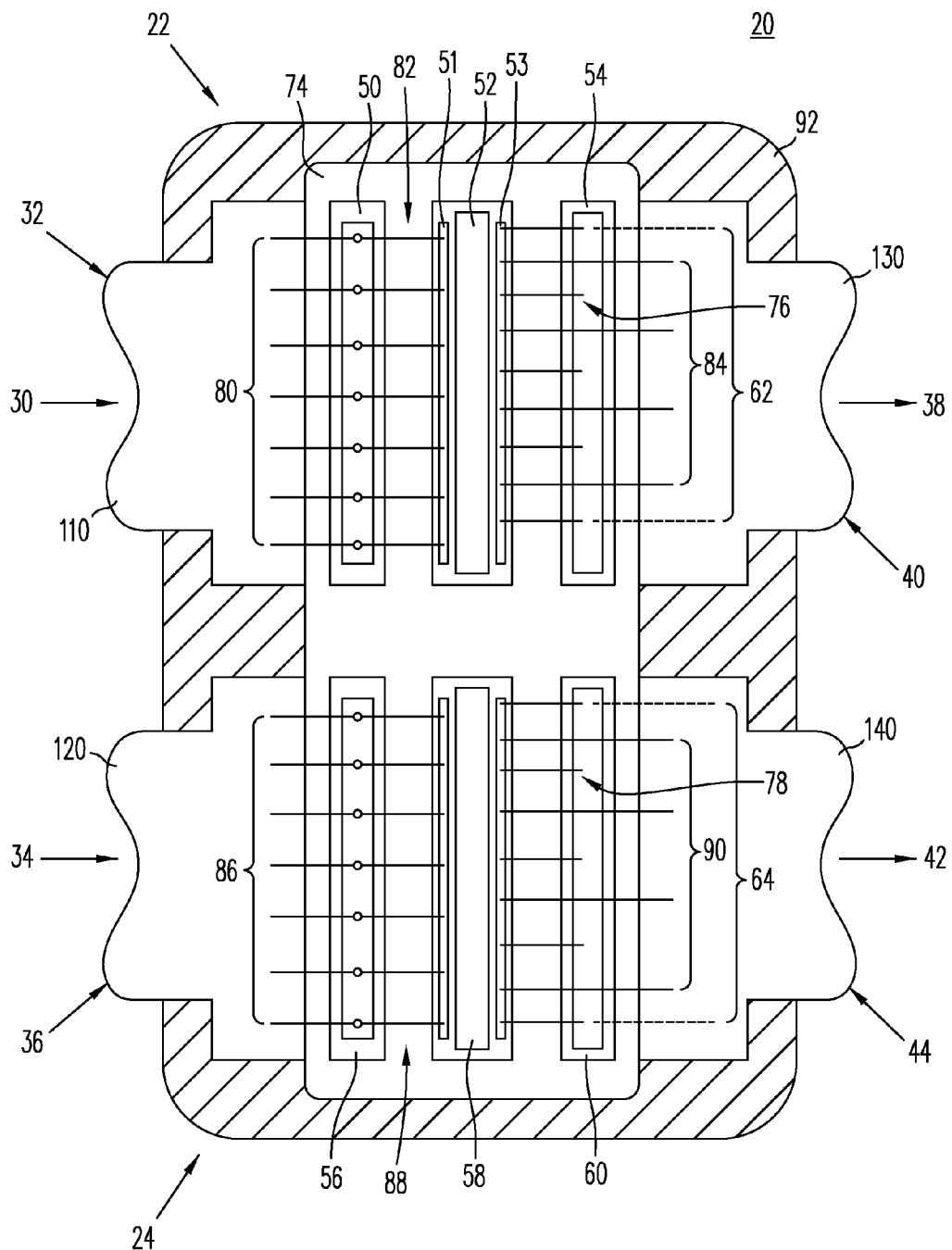
FIG. 1 illustrates an example of an RF amplifier device incorporating a transistor having bus bar bond pads as in the prior art.

FIG. 1 illustrates an example of an RF amplifier device incorporating a transistor having bus bar bond pads as in the prior art. FIG. 1 provides a top schematic view of carrier and peaking amplifier circuits 22 and 24 of a Doherty power amplifier 20 configured in a dual-path semiconductor package. The illustrated semiconductor package is an air cavity package design, provided by way of example. Capacitors 50, 54, 56, and 60, as well as transistors 52 and 58, are semiconductor devices manufactured and subsequently mounted to a surface of a common carrier, such as a package ground plane ("flange") 74. Capacitors 50, 54, 56, and 60 can be, for example, metal-oxide-semiconductor (MOS) capacitors mounted on package ground plane 74. Signal wires 76 of bond wire array 62 interconnect transistor 52 with capacitor 54. Similarly, signal wires 78 of bond wire array 64 interconnect transistor 58 with capacitor 60.

Doherty power amplifier 20 includes additional bond wire arrays. A bond wire array 80 interconnects input node 32 of carrier amplifier circuit 22 with capacitor 50. Another bond wire array 82 interconnects capacitor 50 with an input of transistor 52. Bond wire array 82 is coupled to transistor 52 at a bus bar-type bond pad 51. Bond wire array 84 (having longer signal wires than signal wires 76 of bond wire array 62) can bypass capacitor 54 to interconnect transistor 52 with additional electrical devices, not shown for simplicity of illustration. Both bond wire array 62 and bond wire array 84 are coupled to transistor 52 at a bus bar-type bond pad 53. Similarly, a bond wire array 86 interconnects input node 36 of peaking amplifier circuit 24 with capacitor 56, and another bond wire array 88 interconnects capacitor 56 with an input of a transistor 58. Bond wire array 90 (having longer signal wires than signal wires 78 of bond wire array 64) can bypass capacitor 60 to interconnect transistor 58 with additional electrical devices, again not shown for simplicity of illustration.

FIG. 1 illustrates additional components of a typical package design. As discussed above, the transistors and capacitors of the carrier and peaking amplifiers are mounted on the surface of package ground plane, or flange, 74. An insulating isolator 92 is adhesively mounted or formed on the ground plane, and includes an opening over the mounted transistors and capacitors. A set of input and output pads are then adhesively mounted or formed on isolator 92, which decouples the pads from the package ground plane. Input pads 110 and 120 are physical conductors for input nodes 32 and 36, respectively. Similarly, output pads 130 and 140 provide physical conductors for output nodes 40 and 42, respectively.

Figure 2:
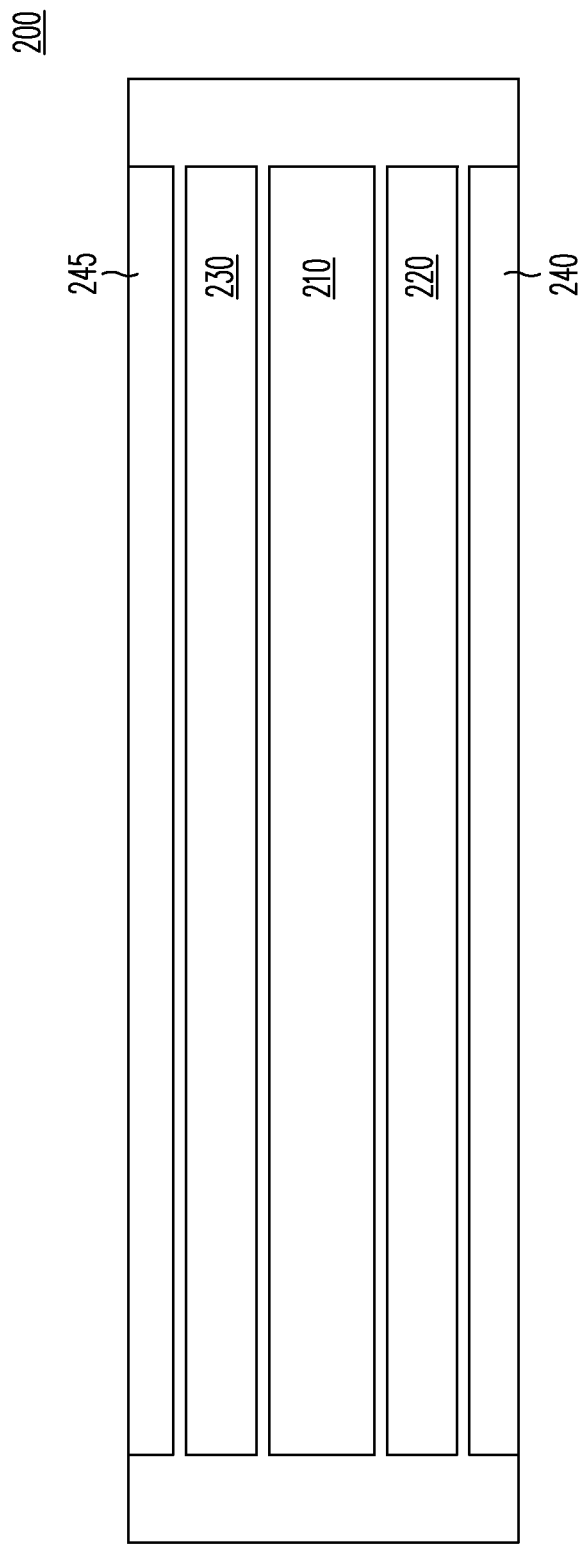
FIG. 2 is a simplified block diagram illustrating a plan view of an example of a MOSFET transistor having traditional bonding pads.

FIG. 2 is a simplified block diagram illustrating a plan view of an example of a MOSFET transistor having traditional bonding pads. MOSFET transistor 200 includes an active region 210 and a neighboring gate bonding pad 220 and drain bonding pad 230. Gate bonding pad 220 and drain bonding pad 230 are bus bars electrically coupled to associated portions of active region 220. As illustrated, the bus bar bonding pads cover a relatively large metal area that provides flexibility for wire bond placement and arrangement. Typically, each bus bar bonding pad is formed over the silicon substrate of the transistor using a metal plating or evaporation process. The example MOSFET in FIG. 2 further provides ground shields 240 and 245 to aid in electrically isolating the bonding pads and the transistor itself.

FIG. 3 is a simplified block diagram illustrating an example of wire bond placement for a MOSFET transistor having traditional bonding pads, such as that illustrated in FIG. 2. FIG. 3 provides a blowup of a portion of drain bonding pad 230. Examples of wire bond footprints attached to drain bonding pad 230 are illustrated (e.g., wire bonds 310, 320, and 330). As shown, the bus bar bonding pad metalized area provides flexibility for placement along both the length of the bonding pad as well as the width of the bonding pad. The availability of this large metalized area helps to ensure a good mechanical connection for the wire bond, as well as a good electrical connection area. But, as discussed above, the large metalized area also contributes to generation of a significant parasitic capacitance between the bus bar bonding pad and the underlying silicon. Embodiments of the present invention seek to reduce the amount of metalized area available to generate parasitic capacitance, while continuing to offer flexibility in placement of wire bonds and availability of sufficient metalized region to enable a good mechanical connection.

FIG. 4 is a simplified block diagram illustrating an example of wire bond placement for a MOSFET transistor having a bonding pad region configured in accord with embodiments of the present invention. The illustration of MOSFET 400 is a blowup of a portion of drain bonding pad region 405, which lies proximate to an active region 410 of the transistor. Drain bonding pad region 405 can lie in approximately the same area as the prior art drain bonding pad 230. Drain bonding pad region 405 includes a bus bar bonding pad 420 formed in the area of drain bonding pad region 405 closest to active region 410. Bus bar bonding pad 420 can be electrically coupled to active region 410 in the same manner that drain bonding pad 230 is coupled to active region 210 of the prior art MOSFET. Bus bar bonding pad 420 is configured, however, to provide significantly less metalized area than prior art bus bar bonding pads by virtue of being formed with a width b that is one-half or less than width a of the prior art bus bar bonding pads.

It is recognized that a bus bar bonding pad having width b may provide insufficient area to mechanically affix a typical wire bond just to the bus bar bonding pad. For certain wire bonding processes, the wire bond can remain attached if as much as 25% of the wire bond is not coupled to metal of a bonding pad and instead lies over silicon. This percentage may vary according to the types of metal and thicknesses of the wire bonds (e.g., 10-40%).

To resolve these issues, while retaining the advantages of a smaller parasitic capacitance due to the smaller area of the bus bar bonding pad, a plurality of small metallic tiles 430 are formed on all or part of the surface of the remaining area of drain bonding pad region 405. These tiles can be formed during the same formation process for bus bar bonding pad 420. Unlike the bus bar bonding pad, metallic tiles 430 are electrically isolated from one another, the bus bar bonding pad, and the active area of the transistor. Thus, each metallic tile does not contribute to parasitic capacitance unless an electrical connection is made to the tile, as described below.

FIG. 4 further illustrates placement of wire bond footprints, such as wire bond footprint 440. Wire bond footprint 440 lies in part over bus bar bonding pad 420, as well as over a subset of the metallic tiles. A wire bond corresponding to wire bond footprint 440 is mechanically and electrically coupled to the bus bar bonding pad as well as any metallic tile encompassed by the wire bond footprint. Only those tiles electrically coupled to the bus bar bonding pad through a wire bond will contribute to parasitic capacitance of drain bonding pad region 405. FIG. 4 illustrates those tiles contributing to the parasitic capacitance using hatching. While tiles electrically coupled to the wire bond will contribute to parasitic capacitance, the additional capacitance due to the tiles will be significantly less than that of the bus bar bonding pad region. Thus, by reducing the metalized area of bus bar bonding pad 420 in the drain bonding pad region to less than half that of a traditional bus bar bonding pad (e.g., drain bonding pad 230), overall parasitic capacitance generated by drain bonding pad region 405 will be less than half that of a traditional drain bonding pad.

It should be appreciated that while the above discussion relates to a drain bonding pad region of a MOSFET transistor, a similarly constructed bonding pad region can be provided for the gate of the MOSFET (i.e., replacing traditional gate bonding pad 220). Further, semiconductor devices other than MOSFETs that incorporate bond pads having large metalized areas can make use of the principals of this invention, incorporating metal tiles to reduce parasitic capacitance generated by the large bond pads.

While the tiles are illustrated as squares in FIG. 4, it should be understood that embodiments of the present invention are not limited to square tiles. Rectangular tiles, circular tiles, and irregularly shaped tiles, for example, can be used so long as a sufficient metalized surface area is provided to ensure a good mechanical wire bond connection, as will be discussed more fully below.

Figure 5:
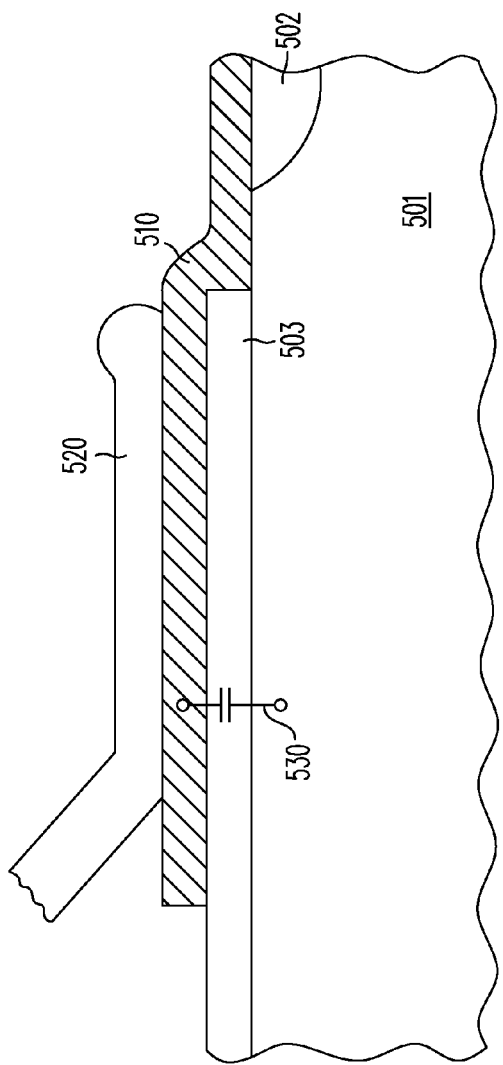
FIG. 5 is a simplified block diagram of a cross section of a bus bar bond pad with a wire bond as provided in traditional MOSFET semiconductor devices.

FIG. 5 is a simplified block diagram of a cross section of a bus bar bond pad with a wire bond as provided in traditional MOSFET semiconductor devices. FIG. 5 illustrates a substrate 501 on which the bus bar bonding pad structure is provided. Substrate 501 may be a semiconductor material, and in some embodiments a bulk substrate wafer of a semiconductor material. As used herein, a semiconductor material may generally refer to a material in which its one or more non-dopant elements are selected essentially from Group IV of the periodic table or, alternatively, may refer to a material in which its plurality of synthesized non-dopant elements are selected from Groups II through VI of the periodic table. Examples of Group IV semiconductor materials which may be suitable for wafer substrate 501 include silicon, germanium, mixed silicon and germanium ("silicon-germanium"), mixed silicon and carbon ("silicon-carbon"), mixed silicon, germanium and carbon ("silicon-germanium-carbon"), and the like. Examples of Group II-V materials suitable for wafer substrate 501 include gallium arsenide, aluminum gallium arsenide, indium gallium arsenide, and the like. Other semiconductor materials are also possible for wafer substrate 501. It is noted that the nomenclature of semiconductor materials may generally refer to the non-dopant compositions of the materials consisting essentially of the referenced elements, but the materials are not restrained from having non-dopant impurities and/or dopants therein. For example, silicon-germanium has a non-dopant composition consisting essentially of silicon and germanium, but is not restricted to having dopants and/or impurities of other elements selected from Groups II through VI of the periodic table. As such, wafer substrate 501 may be undoped or may be doped with p-type or n-type dopants.

Substrate 501 contains a doped area that forms source or drain region 502 of the semiconductor device. Only a portion of source or drain region 502 is shown, since structure of MOSFET semiconductor devices is known in the art. An insulating layer 503 is formed over a portion of substrate 501. In general, insulating layer 503 may include a dielectric material, such as silicon dioxide, silicon nitride, silicon oxynitride, or any combination of such layers to provide electrical isolation between wafer substrate 501 and a conductive line subsequently formed upon insulating layer 503. In some cases, insulating layer 503 may be thermally grown from wafer substrate 501. In other embodiments, insulating layer 503 may be deposited. In either case, an exemplary range of thickness for insulating layer 14 may generally be between approximately 50 angstroms and approximately 300 angstroms. Larger or smaller thicknesses for insulating layer 503, however, may be employed depending on the design specifications of the ensuing devices.

Subsequent to formation of insulating layer 503, a conductive layer 510 is formed upon the insulating layer and over the substrate, including source or drain region 502. Conductive layer 510 forms the bus bar bond pad of the semiconductor device (e.g., bus bar bonding pad 230). Conductive layer 510 can generally include any metallic conductive material, such as, but not limited to, aluminum, copper, tantalum, titanium, tungsten, or any metal alloy. Formation of the bus bar bonding pad can be performed using metal deposition techniques known in the art, for example, plating and evaporation techniques. A wire bond 520 is mechanically affixed to a portion of the bus bar bonding pad, and electrically couples the semiconductor device with another contact.

Capacitance between the bus bar bonding pad illustrated by conductive layer 510 and underlying silicon substrate 501 is illustrated by capacitor 530.

Figure 6:
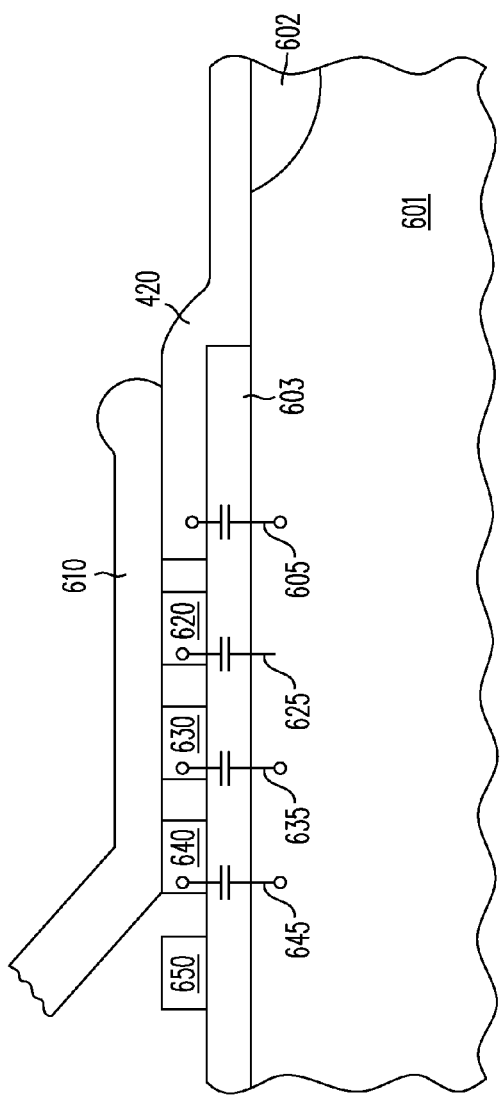
FIG. 6 is a simplified block diagram of a cross section of a bonding pad region with a wire bond, as provided by embodiments of the present invention.

FIG. 6 is a simplified block diagram of a cross section of a bonding pad region with a wire bond, as provided by embodiments of the present invention. A wire bond 610 is mechanically affixed to a portion of bus bar bonding pad 420 (i.e., an active pad), and additional metallic tiles 620, 630, and 640 (i.e., dummy pads). Metallic tile 650 is not in electrical contact with the wire bond. As with the traditional bus bar bond pad in FIG. 5, bus bar bonding pad 420 is formed over a silicon substrate and coupled to the active area of the device (e.g., source or drain region 602). As with FIG. 5, the bus bar bonding pad and the metallic tiles are formed over an insulating layer 603. Formation of the bus bar bonding pad can be performed using metal deposition techniques known in the art, for example, plating and evaporation techniques. Metallic tiles 620, 630, 640, and 650 are formed of the same metal as the bus bar bonding pad, and can be formed during the same metalizing operation. Separation of the tiles from the bus bar bonding pad and each other can be performed using lithography and etching techniques known in the art.

Dimensions of the tiles and the gaps between the tiles are dependent upon the application. A wire bond 610 can typically be formed of a 2-10 mil wire. A thickness of the tiles and the bus bar bonding pad should be sufficient to mechanically support the thickness of the wire bond, and pressures and temperatures asserted to form the wire bond, used in the application. As discussed above, 10-40% of a wire bond may not be in contact with a bonding pad, and the wire bond can maintain adhesion to the bonding pad. Thus, there is significant leeway in gap widths between the tiles and the bonding pad, so long as sufficient wire bond to bonding pad/tile contact is maintained. The gap can be as small as the metalizing process allows (e.g., 5-10 microns).

Capacitance between the bus bar bonding pad 420 and underlying silicon substrate 601 is illustrated by capacitor 605. Similarly, capacitance between metallic tiles 620, 630, and 640 and the substrate is illustrated by capacitors 625, 635, and 645. But there is no capacitance between the substrate and metallic tile 650 because that tile is not coupled to wire bond 610. Since the combined areas of bus bar bonding pad 420 and those of the metallic tiles coupled to the wire bond (e.g., metallic tiles 620, 630, and 640) are less than the area of bus bar bonding pad 230 (e.g., provided by conductive layer 510), the combined capacitances associated with them (e.g., respectively, capacitances 605, 625, 635, 645) are less than the capacitance associated with bus bar bonding pad 230.

Figure 7:
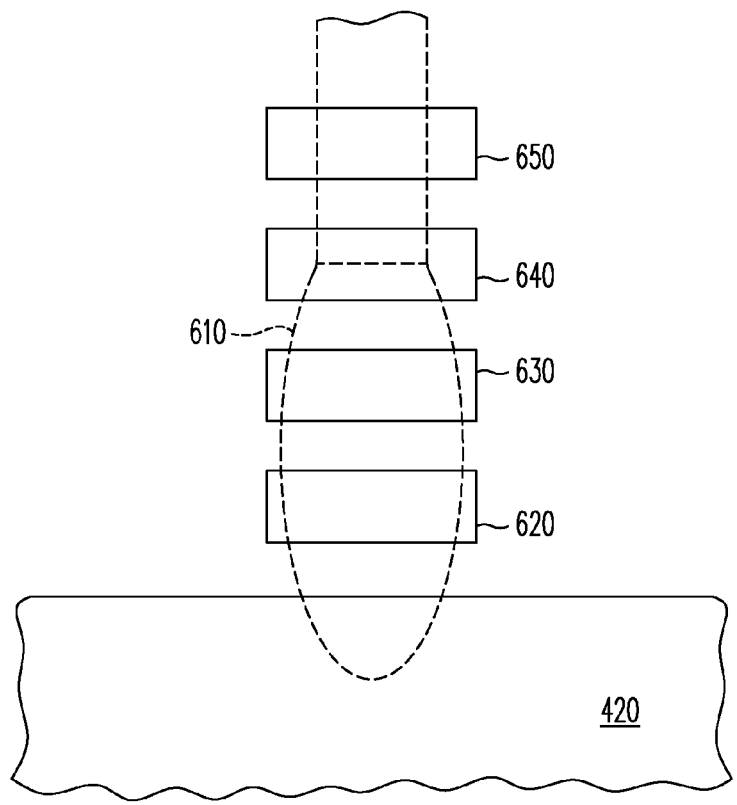
FIG. 7 is a simplified block diagram of a top view of the bonding pad region illustrated in FIG. 6 with a wire bond, as provided by embodiments of the present invention.

FIG. 7 is a simplified block diagram of a top view of the bonding pad region illustrated in FIG. 6 with a wire bond, as provided by embodiments of the present invention. Wire bond 610 is illustrated as spanning a portion of bus bar bonding pad 420 at the "toe" of the wire bond, and metallic tiles 620, 630, and 640. It should be appreciated that embodiments of the present invention are not limited to having the wire bond span only three tiles in addition to the bus bar bonding pad. As discussed above, embodiments of the present invention provide flexibility as to where a wire bond can be attached. But, in order to form an electronic coupling with the active area of the transistor, the wire bond should be in mechanical and electrical contact with the bus bar bonding pad.

Figure 8:
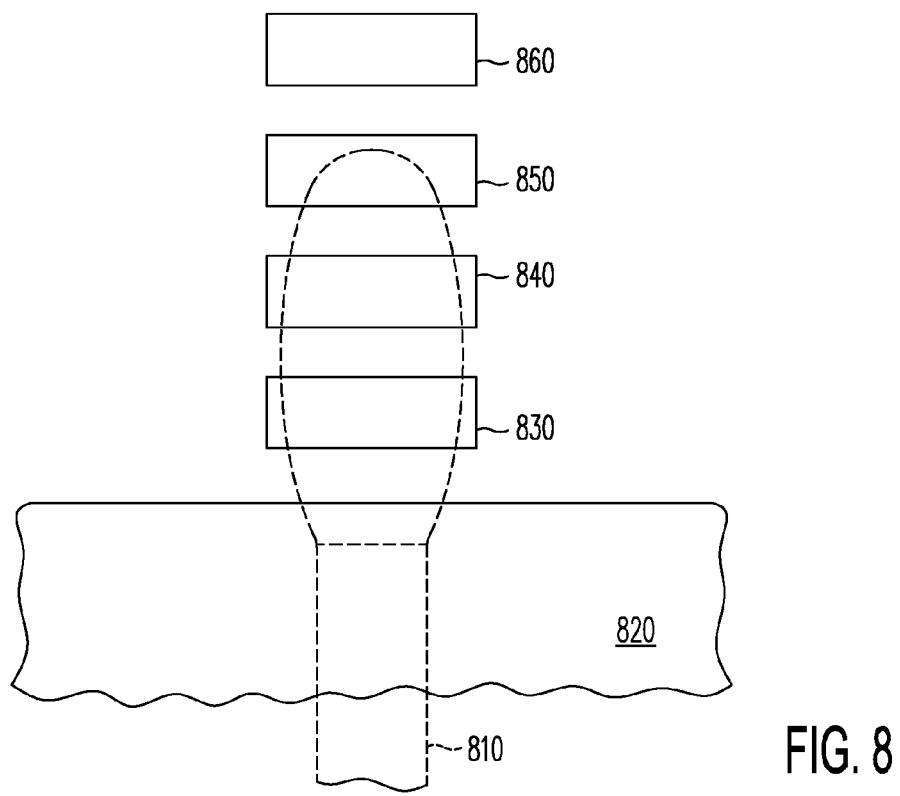
FIG. 8 is a simplified block diagram of a top view of an alternative bonding pad region, as provided by embodiments of the present invention.

FIG. 8 is a simplified block diagram of a top view of an alternative bonding pad region, as provided by embodiments of the present invention. Wire bond 810 is illustrated as spanning a portion of a bus bar bonding pad 820 at the "heel" of the wire bond, and metallic tiles 830, 840, and 850. Again, it should be appreciated that embodiments of the present invention are not limited to having the wire bond span only three tiles in addition to the bus bar bonding pad. But, in order to form an electronic coupling with the active area of the transistor, the wire bond should be in mechanical and electrical contact with the bus bar bonding pad. FIG. 8 illustrates that a wire bond can extend over the active area of the device and be affixed to the bond pad region with the heel of the wire bond attached to the bus bar bonding pad (e.g., the active pad). In fact, the relative locations of the dummy pads (e.g., metallic tiles 830-860) to the active pads (e.g., 820) can be in any formation as appropriate to the application.

In RF applications, reduction of device capacitance is important in order to maximize RF signal gain and minimize signal distortion. In a typical LDMOS design, contribution of a typical bus bar bond pad to that overall capacitance is about 20 percent. Thus, reducing the capacitance of the bond pad region using embodiments of the present invention can provide a significant reduction in the overall capacitance of the device. As discussed above, embodiments of the present invention can provide capacitance reductions of 50 percent or more to the bond pad region by decreasing the metalized area involved in connections to the semiconductor device.

By now it should be appreciated that there has been provided a semiconductor device and apparatus having: an active device region; a bond pad region that includes a first bond pad electrically coupled to the active device region and a plurality of bond pads tiles electrically isolated from the first bond pad, each other the bond pad tiles, and the active device region; and, a wire bond formed on the first bond pad and a subset of the plurality of bond pad tiles.

In one aspect of the above embodiment the active device region includes a MOSFET and the first bond pad is a bus bar. In a further aspect, the bus bar includes one half or less of the bond pad region. In still a further aspect, the bond pad region that does not include the bus bar includes the plurality of bond pads tiles.

A further aspect further includes a first row of bond pads tiles arranged along an edge of the first bond pad. A first gap separates the first row bond pad tiles from the edge of the first bond pad. In a further aspect, the first row bond pad tiles includes a bond pad tiles of the subset of bond pad tiles and the gap is less than a distance necessary to mechanically weaken the wire bond to the first bond pad and a bond pad tile the subset of bond pads tiles. A yet a further aspect includes a second row bond pad tiles having one or more of the subset of the plurality of bond pads tiles.

In another aspect of the above embodiment, the first bond pad includes a larger metalized surface area than any of the plurality of bond pad tiles.

Another embodiment provides a method that includes forming a wire bond on a plurality of metalized surfaces. A first metalized surface of the plurality of metalized surfaces is electrically coupled to an active semiconductor device prior to forming the wire bond. A second metalized surface of the plurality of metalized devices is not electrically coupled to any active semiconductor device prior to said forming the wire bond. The first and second metalized surfaces are separated by a gap that includes a non-metalized surface and the wire bond is formed in contact with the first and second metalized services and over the gap.

In one aspect of the above embodiment, a third metalized surface of the plurality of metalized surfaces is not electrically coupled to either the first metalized surface or the second metalized surface prior to said forming the wire bond and the wire bond is formed in contact with the third metalized surface. In another aspect of the above embodiment, the active semiconductor device is a MOSFET.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, although the figures and examples refer to MOSFET type semiconductor devices, other types of semiconductor devices using bond pads that generate parasitic capacitance due to overlying a large area of silicon can benefit from the present invention. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
    an active device region;
    a bond pad region, wherein the bond pad region comprises
        a first bond pad electrically coupled to the active device region,
        a plurality of bond pad tiles electrically isolated from the first bond pad, each other of the bond pad tiles, and the active device region; and
    a wire bond formed on the first bond pad and a subset of the plurality of bond pad tiles.

2. The semiconductor device of claim 1, wherein
    the active device region comprises a MOSFET, and
    the first bond pad comprises a bus bar.

3. The semiconductor device of claim 2 wherein the bus bar comprises one-half or less of the bond pad region.

4. The semiconductor device of claim 3 wherein the bond pad region not comprising the bus bar comprises the plurality of bond pad tiles.

5. The semiconductor device of claim 4 further comprising:
    a first row of bond pad tiles arranged along an edge of the first bond pad, wherein
        a first gap separates the first row of bond pad tiles from the edge of the first bond pad.

6. The semiconductor device of claim 5, wherein
    the first row of bond pad tiles comprises a bond pad tile of the subset of bond pad tiles, and
    the gap is less than a distance necessary to mechanically weaken the wire bond to the first bond pad and a bond pad tile of the subset of bond pad tiles.

7. The semiconductor device of claim 6 further comprising:
    a second row of bond pad tiles comprising one or more of the subset of the plurality of bond pad tiles.

8. The semiconductor device of claim 1, wherein
    the first bond pad comprises a larger metalized surface area than any of the plurality of bond pad tiles.

9. An apparatus comprising:
a MOSFET device region;
a bond pad region, wherein the bond pad region comprises
   a first bond pad electrically coupled to the MOSFET device region,
   a plurality of bond pad tiles electrically isolated from the first bond pad, each other of the bond pad tiles, and the active device region; and
a wire bond formed on the first bond pad and one or more of the plurality of bond pad tiles.

10. The apparatus of claim 9, wherein the first bond pad comprises a bus bar.

11. The apparatus of claim 10 wherein the bond pad region not comprising the bus bar comprises the plurality of bond pad tiles.

12. The apparatus of claim 11 further comprising:
a first row of bond pad tiles arranged along an edge of the first bond pad, wherein
   a first gap separates the first row of bond pad tiles from the edge of the first bond pad.

13. The apparatus of claim 12, wherein
the first row of bond pad tiles comprises a bond pad tile of the one or more bond pad tiles, and
the gap is less than a distance necessary to mechanically weaken the wire bond to the first bond pad and a bond pad tile of the subset of bond pad tiles.

14. The semiconductor device of claim 13 further comprising:
a second row of bond pad tiles comprising a second bond pad tile of the one or more bond pad tiles.

15. The semiconductor device of claim 9, wherein
the first bond pad comprises a larger metalized surface area than any of the plurality of bond pad tiles.

* * * * *